Dec. 28, 1965 G. G. HARMAN, JR., ET AL 3,226,610

CONSTANT-CURRENT SEMICONDUCTOR DEVICE

Filed June 19, 1962

INVENTORS
George G. Harman, Jr.
Theodore Higier
Owen L. Meyer
Richard L. Raybold
BY David Robbins ATTORNEY
Alvin J. Englert AGENT

United States Patent Office 3,226,610
Patented Dec. 28, 1965

3,226,610
CONSTANT-CURRENT SEMICONDUCTOR DEVICE

George G. Harman, Jr., Theodore Higier, and Owen L. Meyer, Washington, D.C., and Richard L. Raybold, Springfield, Va., assignors to the United States of America as represented by the Secretary of Commerce Filed June 19, 1962, Ser. No. 203,667
1 Claim. (Cl. 317—234)

This invention relates to a constant-current semiconductor device. More particularly it relates to a semiconductor device having a p-type semiconductor body to which is applied at least one coating comprising finely divided particles having the electrical conductivity properties of metal and a work function greater than approximately 4 electron volts, with an electrical lead attached to the coating.

This application is a continuation-in-part of U.S. patent application S.N. 176,834, filed March 1, 1962 by George G. Harman, Jr., Theodore Higier and Owen L. Meyer, now abandoned.

The present invention is based on the discovery that a p-type semiconductor wafer having two contacts possesses unusual properties when at least one of the contacts comprises a coating of finely divided particles having the electrical conductivity properties of metal and a work function greater than approximately 4 ev., to which a lead is attached. Among the properties possessed by such a wafer contact assembly is the property of being a constant-current element when the coating is disposed in an ambient atmosphere containing water vapor and/or one or more gases such as ammonia, acetone or hydrogen sulfide. The application of an increasing voltage across such a device results in a current that rises to a maximum or saturation-current value and thereafter shows substantially no increase for increases of voltage. Another property of such a device is that the saturation value of current can be controlled by adjusting the concentration of the water vapor and/or the gas or gases in the ambient surrounding the coating. Still another property of such a device is that the response to water vapor may be enhanced or modified by permitting the coating and/or body to absorb certain gas or gases.

Accordingly, it is a primary object of the present invention to provide a new semiconductor device in which at least one contact comprises finely divided particles having electrical conductivity properties of metal and a work function greater than approximately 4 ev., and a lead attached to the coating.

Another object of the present invention is to provide a semiconductor device which possesses the property of being a constant-current element.

It is another object to provide a constant-current semiconductor device in which the saturation current is readily adjustable to a desired value.

Still another object of the present invention is to provide a constant-current semiconductor device in which the saturation current is adjusted by varying the concentration of gas in the immediate environment of the device.

Still another object is to provide a semiconductor device having a coating of finely divided metal particles with a work function greater than approximately 4 ev. which are treated by exposure to gas to modify the sensitivity thereof to water vapor.

Other objects and many of the attendant advantages of this invention will be readily appreciated as the same becomes better understood by reference to the following detailed description when considered in connection with the accompanying drawings, in which like reference numerals designate like parts throughout the figures thereof, and wherein.

Figures 1, 2, 3, 4, 5:
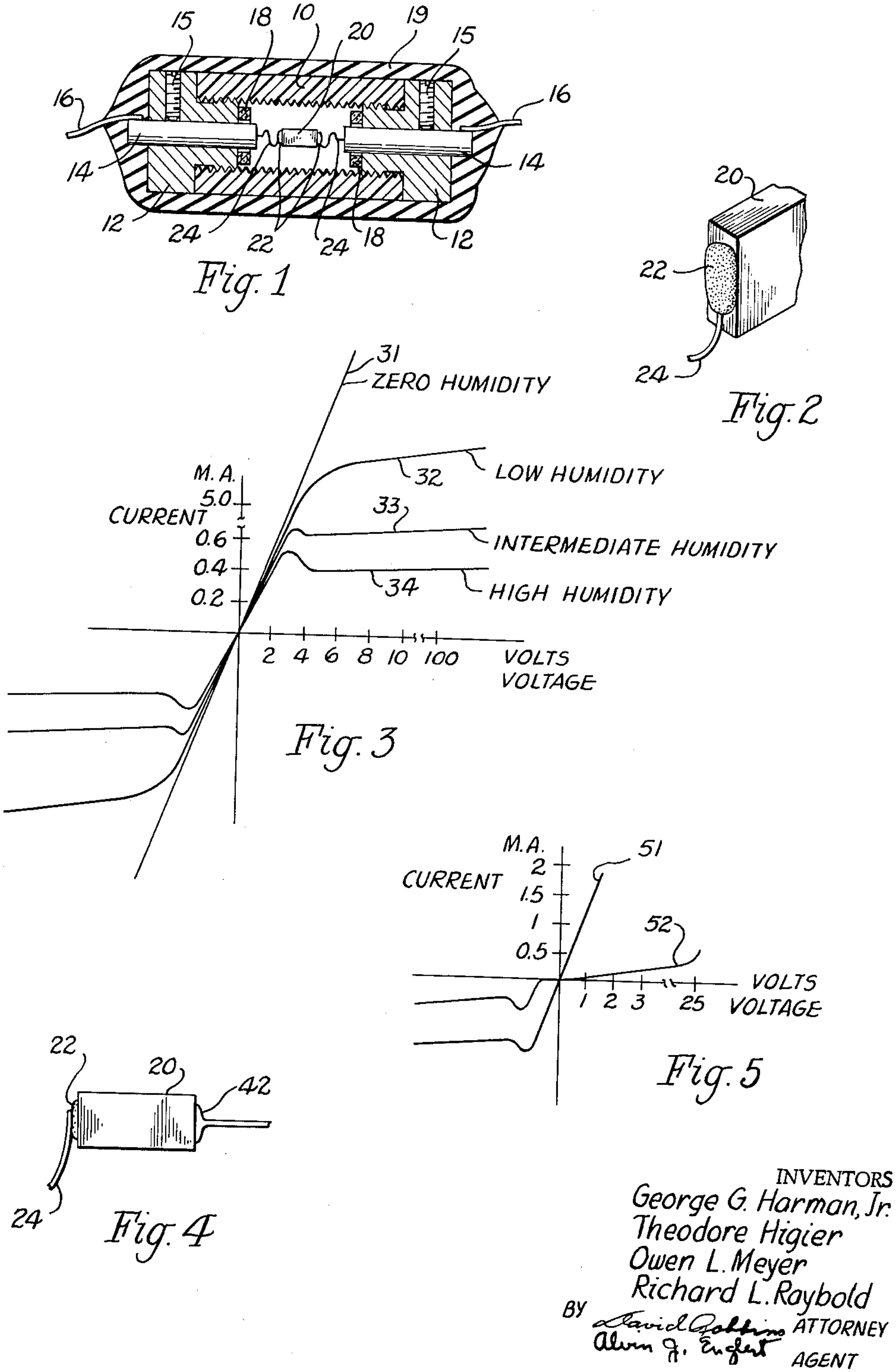
FIG. 1 is an enlarged cross section of a semiconductor device embodying the invention.
FIG. 2 is a greatly enlarged view of a detail of the structure shown in FIG. 1.
FIG. 3 is a graph showing a family of current-voltage characteristics exhibited by a typical embodiment of the invention.
FIG. 4 is a cross section of a further embodiment of the present invention.
FIG. 5 is a graph illustrating the behavior of the device illustrated in FIG. 4.

The exemplary embodiment shown in FIG. 1 consists of a ceramic housing tube 10, internally threaded so as to receive metal fittings 12. Slidably disposed in holes provided in the fittings 12 are pins 14, which are locked by screws 15. External leads or terminals 16 are attached to the outer ends of pins 14 by any convenient means, such as by soldering or welding. Aligned concentric with the inner ends of the fittings 12 are annular sponges 18, which are glued or otherwise fastened to the fittings. The sponges 18 are wetted with water or a saturated solution of a humidity-regulating salt in water to maintain a desired humidity in the interior of housing 10, and a water-impervious coating 19 surrounds the entire ceramic tube 10 and associated ends 12. Within the housing 10, resilient leads 24 have one end attached to the pins 14 and the other end in contact with coatings 22 disposed on a semiconductor body 20. If desired, an additional support (not shown) for the body 20 may be provided within ceramic tube 10.

In accordance with the present invention, the semiconductor body 20 is a small block of p-type material, such as the p-types of silicon, germanium, or silicon carbide. An advantageous shape for the body 20 is that of a rectangular parallelepiped obtained by slicing a piece of the selected material. The slice is polished and etched in accordance with common techniques, with sufficient etching to remove substantially all of the surface work-damage.

The coatings 22 are applied to opposite ends of the semiconductor body 20. As illustrated by the magnified representation of FIG. 2, each coating comprises a mass of metal particles disposed as a porous film or coating on the body 20. The basic criteria is simply for the porous contact to be ohmic, when desiccated. Thus, the particles may be of any material having the electrical conductivity properties of a metal having a work function greater than approximately 4 ev., such as carbon, gold or silver which have work functions of 4.39, 4.58 and 4.28 ev., respectively. The work function data for these metals is taken from H. B. Michaelson's article in the Journal of Applied Physics 21, 537 (1950).

When carbon is used, the coating can be obtained by brushing or wiping the ends of body 20 with a paste consisting of carbon powder or graphite in water. If desired, the carbon powder-water mixture may be modified by the addition thereto of a binder such as gum arabic or a mixture of neutralized silicates. Alternatively, commercial mixtures, such as Graphite Dispersion No. 226 (Acheson Colloids Company), may be employed to form the coatings 22. The selected coatings are then preferably permitted to dry at room temperature, for fifteen to thirty minutes, followed by a period of fifteen to thirty minutes within an oven at 60 to 80° C. to stabilize the form of the coatings 22.

When the coatings 22 are dry, the leads 24 are attached thereto by pressing the end portions thereof against the coatings. The dry coatings 22 are moderately adhesive and therefore tend to hold the leads 24 during assembly of the device into the ceramic housing 10 of FIG. 1.

When gold or silver is used, a coating can be obtained by brushing or wiping the ends of body 20 with a conductive paint made with semicolloidal gold or silver having porous water-based binders. These may be commercial paints such as the Cold-Setting Gold or Silver paints which may be obtained from the Hanovia Liquid Gold Division of the Hanovia Company.

If further adhesion of the leads is desired, further coatings of carbon powder-water mixture or semicolloidal gold or silver may be applied over the portions of leads 24 that are pressed against the original coating. Such further coatings should be dried in the manner described in connection with the first coating, whereby the leads become essentially embedded in the coatings 22 as shown in FIG. 2.

The electrical characteristics of the above-described device are illustrated in FIG. 3. Under conditions of zero humidity, the current linearly increases with voltage, as shown by curve 31, indicating that the coatings 22 are essentially ohmic in nature when dry. In the presence of water vapor, however, the current of the device increases with voltage to a saturation level, which is maintained despite increases in voltage as shown by curves 32 to 34. In typical embodiments of the invention, the saturation-current level occurs at voltages in the order of a fraction of a volt to several volts and is stable for voltages that are in the range of 50 to 100 volts. The saturation-current level is further an inverse function of humidity, being high at low humidity and low at high humidity. The humidity dependence is illustrated by curves 32 to 34 of FIG. 3. In curves 33 and 34, the current tends to "overshoot" before levelling off to the saturation level. The overshoot portion of current is a capacitive charging current associated with a non-linear capacity effect, which effect may be utilized in devices requiring non-linear capacitors, such as parametric amplifiers and the like.

It has been found that if body 20 is p-type semiconductor material, such as silicon, the saturation current associated with a given humidity may be adjusted by treating the semiconductor material beneath the coatings 22 with certain gases. For example, exposure of the coatings 22 to ammonia for a short period causes the saturation current at a given humidity to be lower than the saturation current in an otherwise identical device. It appears that the ammonia enhances the action of the water vapor in creating a saturation-current effect. Furthermore, the enhancement due to the ammonia is a substantially permanent phenomena, which suggests that the ammonia forms a chemical bond with the p-type silicon. To treat the device with ammonia, the body 20 may be dipped in an ammonia solution before the coatings 22 are applied, or the device may be constructed with the coatings and then exposed to ammonia vapors.

Other gases which may be diffused into the coatings 22 on a device having a body 20 of p-type silicon, so as to affect the saturation current associated with a given humidity are hydrogen chloride and chlorine. The effect of these gases differs from the effect of ammonia in that they increase the saturation current for a given humidity, whereas ammonia tends to decrease the value of the saturation current. This property can be employed by itself, or in combination with the property of ammonia. In the latter case, a device that has been "over-exposed" to ammonia whereby it exhibits a lower saturation current than desired (for the intended humidity range) may conveniently be treated with hydrogen chloride or chlorine so as to raise the saturation current to the desired value.

In the exemplary embodiment illustrated in FIG. 1, the semiconductor device having coatings 22 is disposed in an atmosphere containing water vapor, as provided, inter alia, by the sponges 18. In an alternative exemplary embodiment, the device may be disposed in an atmosphere containing hydrogen sulfide gas, ammonia or acetone. In such an atmosphere, the device exhibits a constant-current behavior similar to the behavior described in connection with water vapor. It appears that hydrogen sulfide, ammonia or acetone affects the coating-semiconductor region in much the same way that water vapor does. The atmosphere surrounding the device may, of course, contain more than one of the above gases, in which case, the saturation-current level is dependent on the combined concentrations of the gases in the ambient.

In accordance with a further aspect of the present invention, one of the two contacts applied to the semiconductor body 20 may be a conventional metallic-type contact. As illustrated in FIG. 4, the p-type semiconductor body 20 may be provided with coatings 22 at one end, and at the other end may be provided with a metallic contact 42 such as alloyed aluminum. In such a device the behavior, as illustrated by curve 51 in FIG. 5, is essentially "ohmic" in the forward direction, and "constant current" in the reverse direction.

Alternatively, the device illustrated in FIG. 4 may be provided with a metallic-type contact 42 consisting of either indium, gallium, or an indium-gallium mixture (not diffused or alloyed), in which case the device exhibits a very high resistance (approximately 1 megohm) for voltages the magnitudes of which are below the order of one to two volts, after which magnitude of voltage the high resistance breaks down and the behavior is controlled by the coatings 22. The behavior of the latter device is illustrated by curve 52 of FIG. 5.

Many uses for the devices of the present invention will be obvious to the workers in the art. An exemplary, but not exhaustive, list of uses includes use as a current regulator. In such use, the sponges 18 disposed in the housing 10 illustrated in FIG. 1 are moistened with water or a saturated solution of a humidity-regulating salt in water to the degree required for the device to exhibit the desired saturation-current level. Another exemplary use of the device is in connection with the detection of humidity. In such use, the semiconductor body 20 and coatings 22 would be exposed to the atmosphere by providing openings in the housing therefor. The sponges 18 would of course be dispensed with, and the coatings 22 would be formed as thin films, so as to obtain a fast response characteristic. A final exemplary use for the instant devices is in connection with the detection of radiation. Since a moistened coating provides a surface barrier, the impingement of radioactive particles on the barrier would affect the current through the device. The instant devices in the presence of water vapor are also responsive to neutrons, inasmuch as water molecules in contact with the semiconductor are disturbed by the neutrons, whereby the current flow through the device is modified.

Obviously many modifications and variations of the present invention are possible in the light of the above teachings. It is therefore to be understood, that within the scope of the appended claim, the invention may be practiced otherwise than as specifically described.

What is claimed is:

A constant-current semiconductor device comprising, a body of p-type semiconductor material, a gas-permeable coating containing particles of a material selected from the group consisting of carbon, silver and gold disposed on a portion of said body, a first lead at least partially embedded in said coating, a second lead electrically connected to said body, an enclosure surrounding said body, coating and leads, said leads extending through said enclosure, said enclosure containing at least one gas selected from the group consisting of water vapor, ammonia, acetone vapor, and hydrogen sulfide.

(References on following page)

References Cited by the Examiner

UNITED STATES PATENTS

| | | | |
|---|---|---|---|
| 2,109,879 | 3/1938 | De Boer et al. | 317—241 |
| 2,227,827 | 1/1941 | Dubar. | |
| 2,375,355 | 5/1945 | Fahraeous et al. | 317—241 X |
| 2,711,511 | 6/1955 | Pietenpol | 317—235 |
| 2,714,149 | 6/1955 | Craig et al. | 338—35 |
| 2,856,681 | 10/1958 | Lacy. | |
| 2,887,453 | 5/1959 | Billig et al. | 252—62.3 |
| 3,003,900 | 10/1961 | Levi | 148—189 |
| 3,051,895 | 8/1962 | Carson | 324—71 |
| 3,097,977 | 7/1963 | Amick et al. | 148—33.3 X |

FOREIGN PATENTS

| | | |
|---|---|---|
| 795,031 | 5/1958 | Great Britain. |

JOHN W. HUCKERT, *Primary Examiner.*

JAMES D. KALLAM, *Examiner.*

A. S. KATZ, J. D. CRAIG, *Assistant Examiners.*